(12) United States Patent
Lim et al.

(10) Patent No.: US 8,664,750 B2
(45) Date of Patent: Mar. 4, 2014

(54) SEMICONDUCTOR SUBSTRATE, PACKAGE AND DEVICE

(75) Inventors: Shoa Siong Lim, Singapore (SG); Kian Hock Lim, Singapore (SG)

(73) Assignee: Advanpack Solutions Pte. Ltd., Kallang (SG)

( * ) Notice: Subject to any disclaimer, the term of this patent is extended or adjusted under 35 U.S.C. 154(b) by 141 days.

(21) Appl. No.: 13/128,043

(22) PCT Filed: Nov. 17, 2009

(86) PCT No.: PCT/SG2009/000428
§ 371 (c)(1),
(2), (4) Date: May 6, 2011

(87) PCT Pub. No.: WO2010/056210
PCT Pub. Date: May 20, 2010

(65) Prior Publication Data
US 2011/0210429 A1  Sep. 1, 2011

Related U.S. Application Data

(60) Provisional application No. 61/115,490, filed on Nov. 17, 2008.

(51) Int. Cl.
*H01L 23/552* (2006.01)

(52) U.S. Cl.
USPC ........... 257/659; 257/697; 257/700; 257/701; 257/737; 257/738

(58) Field of Classification Search
None
See application file for complete search history.

(56) References Cited

U.S. PATENT DOCUMENTS

| | | | |
|---|---|---|---|
| 7,061,120 B2 | 6/2006 | Shin et al. | |
| 2003/0043556 A1 * | 3/2003 | Sugimoto et al. | 361/760 |
| 2004/0011699 A1 | 1/2004 | Park | |
| 2004/0145044 A1 | 7/2004 | Sugaya et al. | |
| 2004/0175916 A1 | 9/2004 | Shin et al. | |
| 2004/0207058 A1 | 10/2004 | Sohn | |
| 2005/0253211 A1 * | 11/2005 | Minamio et al. | 257/432 |

FOREIGN PATENT DOCUMENTS

CN  1697190  11/2005

OTHER PUBLICATIONS

Chinese language office action dated Aug. 13, 2012.
English language translation of abstract of CN 1697190 (published Nov. 16, 2005).
TW Office Action dated Jun. 14, 2013.

* cited by examiner

*Primary Examiner* — Kyoung Lee
(74) *Attorney, Agent, or Firm* — McClure, Qualey & Rodack, LLP

(57) ABSTRACT

A semiconductor substrate including a carrier, a first conductive layer and a second conductive layer is disclosed. The carrier has a first surface, a second surface, and a concave portion used for receiving a semiconductor element. The first conductive layer is embedded in the first surface and forms a plurality of electric-isolated package traces. The second conductive layer is embedded in the second surface and electrically connected to the first conductive layer. The semiconductor substrate can be applied to a semiconductor package for carrying a semiconductor chip, and combined with a filling structure for fixing the chip. Furthermore, a plurality of the semiconductor substrates can be stacked and connected via adhesive layers, so as to form a semiconductor device with a complicated structure.

37 Claims, 8 Drawing Sheets

US 8,664,750 B2

SEMICONDUCTOR SUBSTRATE, PACKAGE AND DEVICE

CROSS REFERENCE TO RELATED APPLICATION

This application is the 35 U.S.C. §371 national stage of PCT application PCT/SG2009/000428, filed Nov. 17, 2009, claiming priority of U.S. Provisional Patent Application 61/115,490, filed Nov. 17, 2008, herein incorporated by reference in their entirety.

BACKGROUND OF THE INVENTION

1. Field of the Invention

The invention relates in general to semiconductor substrate, and more particularly to semiconductor substrate, semiconductor package, semiconductor device and manufacturing methods thereof.

2. Description of the Related Art

Nowadays, with the trend of miniaturization of electronic products expected by consumers, the size of the semiconductor device used in an electronic product is also limited so as to satisfy required specification. However, the miniaturization of the semiconductor device is related to the internal structure of the semiconductor device, which should be taken into consideration when downsizing the semiconductor device. For example, as a semiconductor device such as an integrated circuit chip needs to perform complicated logic function, the layout of the internal conductive traces of the semiconductor device should be accurately controlled. However, under such circumstances, the size of the semiconductor device is difficult to reduce, constraining the miniaturization of the semiconductor device.

The electronic packaging structures of semiconductor device include single chip packaging and multi-chip packaging. In package on package (POP) packaging, a plurality of semiconductor substrates are superimposed, largely increasing the overall thickness of the device. Therefore, the purpose of miniaturization is seldom achieved. The problem about how to abate the above situation of miniaturization is an important issue in the development of semiconductor device.

SUMMARY OF THE INVENTION

It is therefore an object of the invention to provide a semiconductor substrate, a semiconductor package, a semiconductor device and manufacturing methods thereof. The semiconductor substrate has a concave portion for receiving a semiconductor element such as a semiconductor chip, thus the overall thickness is reduced, facilitating the miniaturization of the semiconductor device.

The invention achieves the above-identified object by providing a semiconductor substrate, which includes a carrier, a first conductive layer and a second conductive layer. The carrier has a first surface and a second surface opposite to the first surface, wherein the carrier further has a concave portion for receiving a semiconductor element. The first conductive layer is embedded in the first surface and forms a plurality of electro-isolated package traces. The second conductive layer is embedded in the second surface and electrically connected to the first conductive layer.

The invention achieves the above-identified object by providing a semiconductor package, which includes a carrier, a first conductive layer, a second conductive layer, a semiconductor chip and a filling structure. The carrier has a first surface and a second surface opposite to the first surface, wherein the carrier further has a concave portion. The first conductive layer is embedded in the first surface and forms a plurality of electro-isolated package traces. The second conductive layer is embedded in the second surface and electrically connected to the first conductive layer. The semiconductor chip is disposed in the concave portion. The filling structure is disposed in the concave portion for filling the gap between the semiconductor chip and the carrier.

The invention achieves the above-identified object by providing a semiconductor device, which includes a plurality of semiconductor substrates and a plurality of adhesive layers. The semiconductor substrates are disposed layer by layer. Each of the semiconductor substrates includes a carrier, a first conductive layer and a second conductive layer. The carrier has a first surface and a second surface opposite to the first surface, wherein the carrier further has a concave portion. The first conductive layer is embedded in the first surface and forms a plurality of electro-isolated package traces. The second conductive layer is embedded in the second surface and electrically connected to the first conductive layer. The adhesive layers are disposed between the semiconductor substrates for combining the semiconductor substrates.

The invention achieves the above-identified object by providing a manufacturing method of semiconductor substrate. The manufacturing method includes the steps of: providing a base layer; forming a first conductive layer on the base layer so as to form a plurality of electro-isolated package traces; forming a second conductive layer on the first conductive layer; forming a molding material layer for covering the first conductive layer and the second conductive layer; forming a concave portion on the molding material layer and exposing the second conductive layer so as to form a carrier; and, removing the base layer.

The invention achieves the above-identified object by providing a manufacturing method of semiconductor package. The manufacturing method includes the steps of: providing a base layer; forming a first conductive layer on the base layer so as to form a plurality of electro-isolated package traces; forming a second conductive layer on the first conductive layer; forming a molding material layer for covering the first conductive layer and the second conductive layer; forming a concave portion on the molding material layer and exposing the second conductive layer so as to form a carrier; removing the base layer; disposing a semiconductor chip in the concave portion; and, forming a filling structure in the concave portion for filling the gap between the semiconductor and the carrier.

The invention achieves the above-identified object by providing a manufacturing method of semiconductor device. The manufacturing method includes the steps of: providing a plurality of semiconductor substrates, wherein each of the semiconductor substrates comprises a carrier, a first conductive layer and a second conductive layer, the carrier has a concave portion, the first conductive layer is embedded in a first surface of the carrier, and the second conductive layer is embedded in a second surface of the carrier opposite to the first surface; providing a plurality adhesive layers between the semiconductor substrates; and, combining the semiconductor substrates by bonding the adhesive layers.

Other objects, features, and advantages of the invention will become apparent from the following detailed description of the preferred but non-limiting embodiments. The following description is made with reference to the accompanying drawings.

DETAILED DESCRIPTION OF THE INVENTION

The semiconductor substrate, the semiconductor package and the semiconductor device according to the preferred embodiment of the invention, as well as their manufacturing methods, are disclosed. FIGS. 1 to 14 show the process of a manufacturing method of the semiconductor substrate.

Figure 1:
FIGS. 1 to 14 show the process of a manufacturing method of the semiconductor substrate.

As shown in FIG. 1, a base layer 100 is provided. The base layer 100 is preferably a conductive structure whose material is steel.

Figure 2:
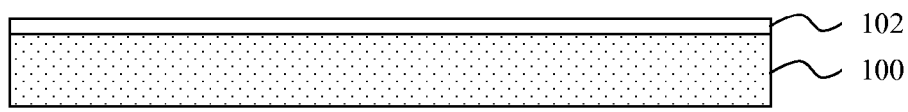

Next, as shown in FIG. 2, a photo-resist layer 102 is formed on the base layer 100. The material of the photo-resist layer 102 can be positive type resist or negative type resist.

Figure 3:
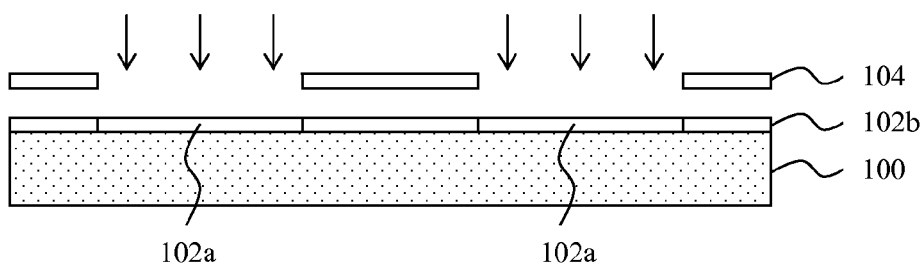
Figure 4:
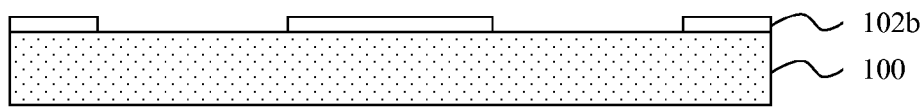

Then, as shown in FIG. 3, the photo-resist layer 102 is patterned by, for example, lithography process. A photo mask 104 with pattern design is disposed above the photo-resist layer 102 such that the photo-resist layer 102 is selectively exposed to the radiation, and the pattern of the photo mask 104 is transferred to the photo-resist layer 102. The photo-resist layer 102 is a positive type photo-resist layer, for example, so its exposed portion 102a will dissolve in a developer liquid used in the following developing process and will be rinsed. At last, a patterned photo-resist layer 102b will be retained on the base layer 100, as shown in FIG. 4.

Figure 5:
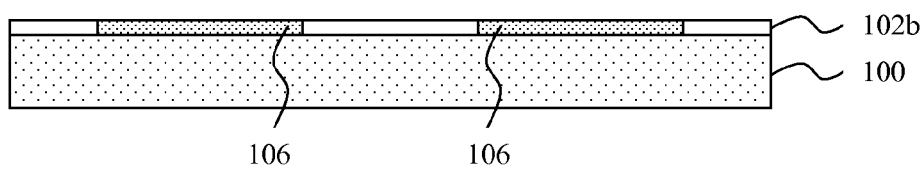
Figure 6:
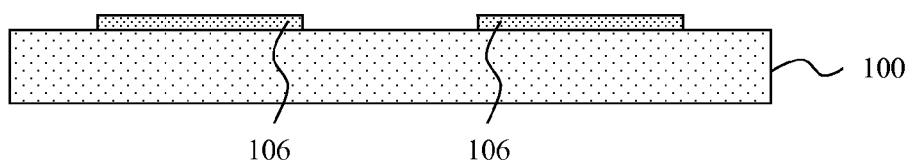

Next, as shown in FIG. 5, a first conductive layer 106 is formed on the base layer 100 so as to form a plurality of electro-isolated package traces. Due to the patterned photo-resist layer 102b disposed on the base layer 100, the material of the first conductive layer 106 is formed in the openings of the patterned photo-resist layer 102b. The first conductive layer 106 can be formed by plating, and preferably has more than one layer whose material is Cu, Ni, Au, or Sn. The multi-layer structure of the first conductive layer 106 and its required thickness can be achieved by repeating the relative steps above. Afterwards, the patterned photo-resist layer 102b is removed, and the first conductive layer 106 is retained on the base layer 100, as shown in FIG. 6. The package traces of the first conductive layer 106 can be arranged according to a required trace pattern, so as to form a conductive trace layout, which relates to the operating function of the device.

Figure 7:
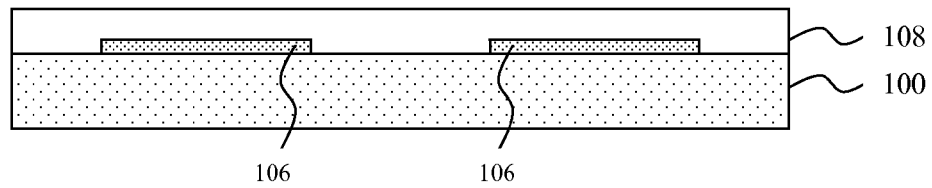

Then, as shown in FIG. 7, another photo-resist layer 108 is formed on the base layer 100 and covers the first conductive layer 106. The material of the photo-resist layer 108 can also be positive type resist or negative type resist.

Figure 8:
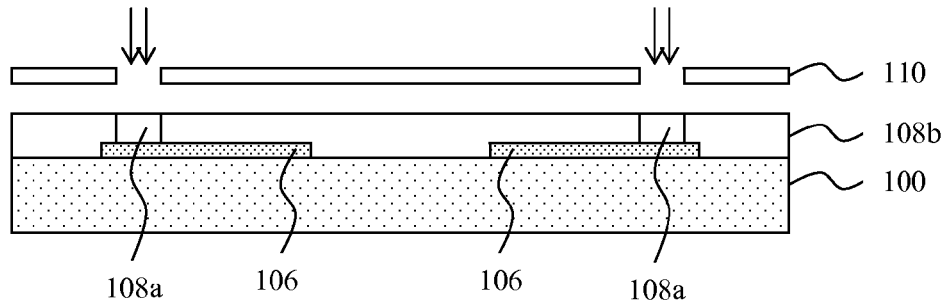
Figure 9:
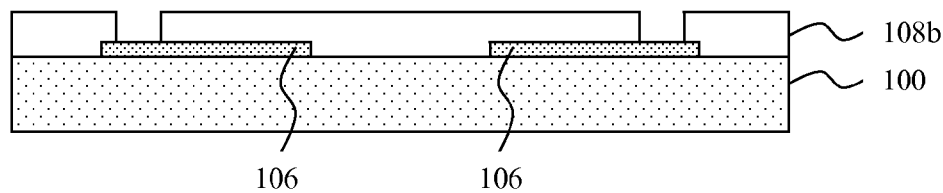

Next, as shown in FIG. 8, the photo-resist layer 108 is patterned by, for example, lithography process. A photo mask 110 is disposed above the photo-resist layer 108 such that the photo-resist layer 10 is selectively exposed to the radiation, and the pattern of the photo mask 110 is transferred to the photo-resist layer 108. The photo-resist layer 108 is a positive type photo-resist layer, for example, so its exposed portion 108a will dissolve in a developer liquid used in the following developing process and will be rinsed. At last, a patterned photo-resist layer 108b will be retained on the base layer 100, as shown in FIG. 9. The openings of the patterned photo-resist layer 108b are positioned in accordance with the first conductive layer 106.

Figure 10:
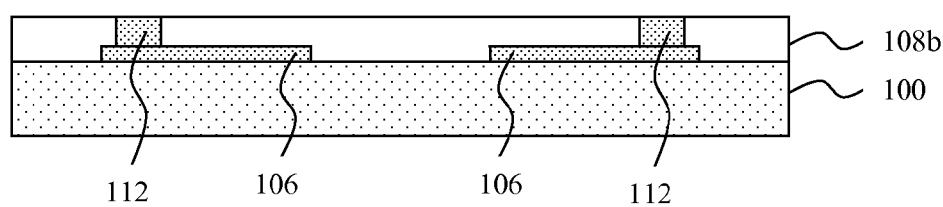
Figure 11:
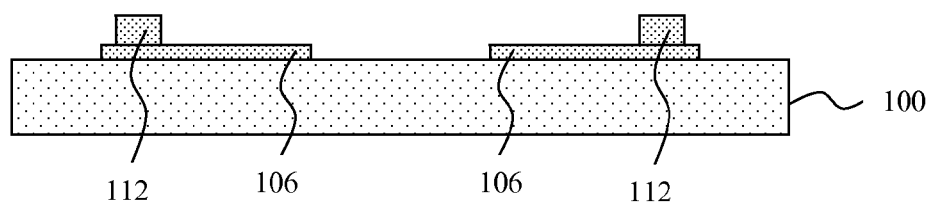

Then, as shown in FIG. 10, a second conductive layer 112 is formed on the first conductive layer 106. Because of the patterned photo-resist layer 108b disposed on the base layer 100, the material of the second conductive layer 112 is formed in the openings of the patterned photo-resist layer 108b. The second conductive layer 112 can be formed by plating, and has more than one layer whose material is Cu, Ni, Au, or Sn. The multi-layer structure of the second conductive layer 112 and its required thickness can be achieved by repeating the relative steps above. Afterwards, the patterned photo-resist layer 108b is removed, and the second conductive layer 112 is retained on the first conductive layer 106, as shown in FIG. 11. The second conductive layer 112 consists of a plurality of conductive studs. The number and location of the conductive studs are preferably in accordance with the package traces of the first conductive layer 106. The above process relative to the formation of the first conductive layer 106 and the second conductive layer 112 can be repeated several times in order to form more conductive layers for performing the required function.

Figure 12:
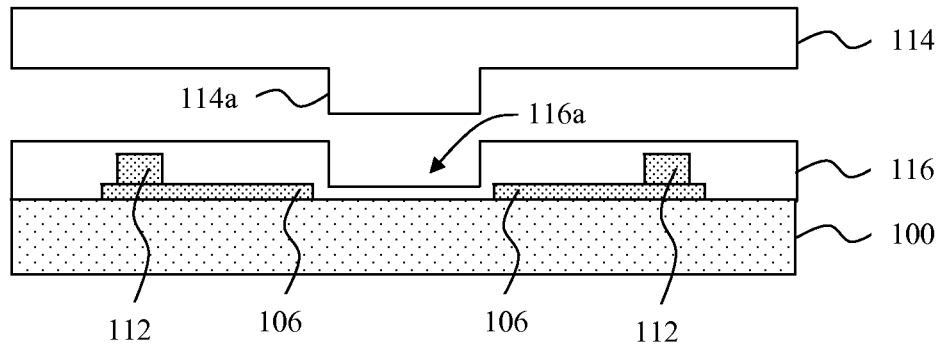

Next, a molding material layer is formed for covering the first conductive layer 106 and the second conductive layer 112. The material of the molding material layer is preferably an insulating material. As shown in FIG. 12, a mold 14 having a protrusion 114a is used for forming a concave portion 116a on the molding material layer 116.

Figure 13:
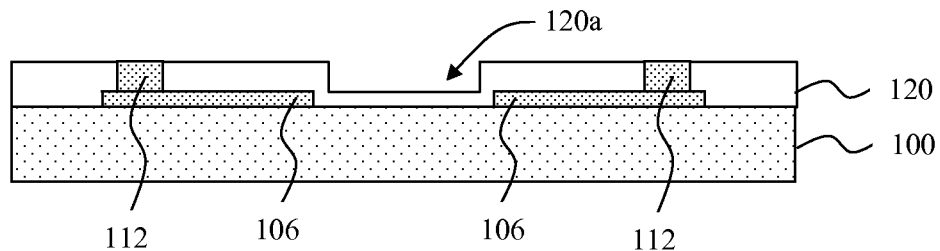
Figure 14:
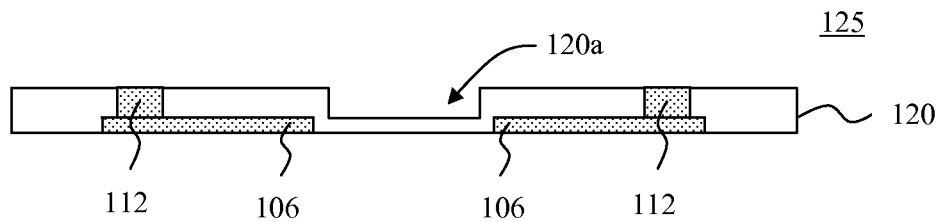

Then, the molding material layer 116 is thinned by grinding for exposing the upper surface of the second conductive layer 112. As shown in FIG. 13, a carrier 120 and its concave portion 112a are thus formed. After that, the base layer 100 is removed, as shown in FIG. 14, and the manufacture of a semiconductor substrate 125 is completed.

Furthermore, depending on the process, the exposed trace or stud surface of the first conductive layer 106 and the second conductive layer 112 can be protruding or recessed from the surface of the carrier 120. For example, after the step of exposing the trace surface, a layer of trace can also be further removed by etching such that the trace surface is recessed from the surface of the carrier 120, On the other hand, additional metal layers can be added by, for example, electroless nickel immersion gold (ENIG) process, on the trace surface such that it protrudes from the surface of the carrier 120. Similar processes can also be applied to the stud surface.

The semiconductor substrate 125 can be manufactured according to other method. FIGS. 15 to 21 show the process of another manufacturing method of the semiconductor substrate. The manufacturing method includes the above steps shown in FIGS. 1 to 5, which are not repeatedly described in the following.

Figure 15:
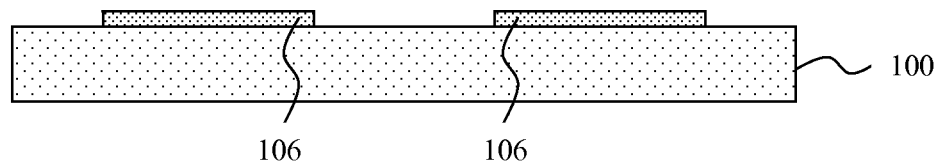
FIGS. 15 to 21 show the process of another manufacturing method of the semiconductor substrate.
Figure 16:
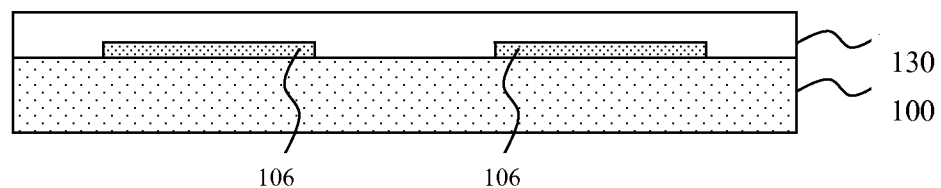

As shown in FIGS. 15 and 16, a molding material layer 130 is formed on the base layer 100 and covers the first conductive layer 106. The material of the molding material layer 130 is preferably an insulating material.

Figure 17:
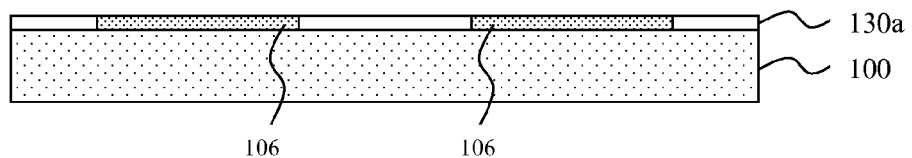

Next, the molding material layer 130 is thinned by grinding to form a molding material layer 130a with a smaller thickness, and the upper surface of the first conductive layer 106 is exposed, as shown in FIG. 17.

Figure 18:
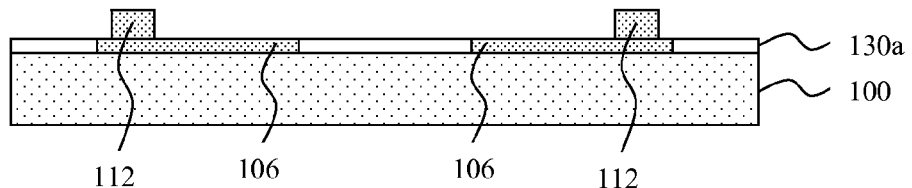

Then, as shown in FIG. 18, using similar processes described in FIGS. 7 to 11 forms a second conductive layer 112 on the first conductive layer 106.

Figure 19:
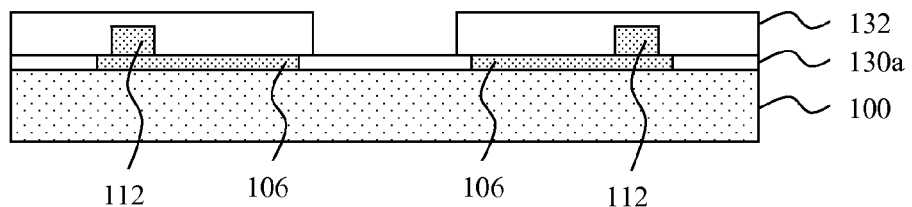

Next, as shown in FIG. 19, another molding material 132 is formed on the molding material layer 130a for covering the first conductive layer 106 and the second conductive layer 112. Then, a mold similar to the mold 14 of FIG. 12 is used for forming a concave portion on the molding material layer.

Figure 20:
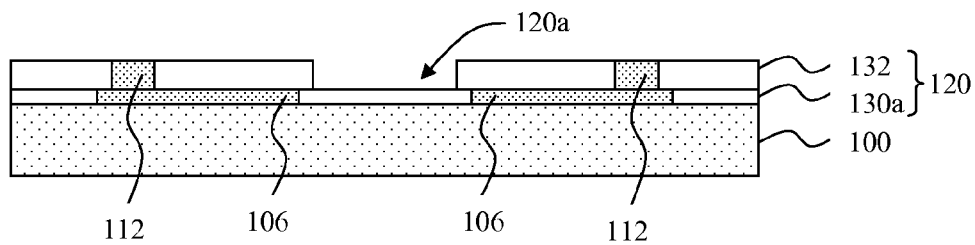

After that, the molding material layer is thinned by grinding to expose the upper surface of the second conductive layer 112. As shown in FIG. 20, the formation of the carrier 120 and its concave portion 120a is completed. At last, the base layer 100 is removed, and the manufacture of the semiconductor substrate 125 (shown in FIG. 14) is finished.

Figure 21:
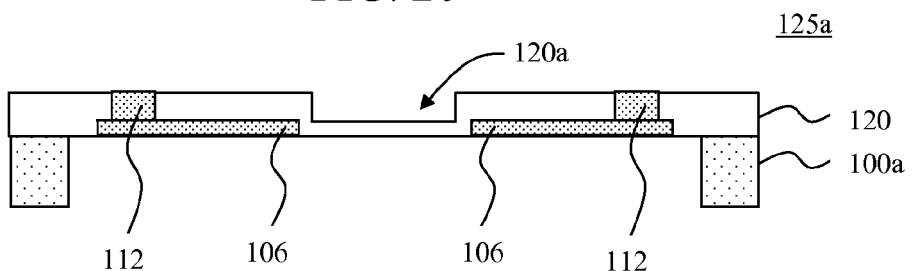

Alternatively, as shown in FIG. 21, the material of the base layer 110 can be partially removed for forming a ring-shaped structure 100a. The ring-shaped structure 100a enhances the supporting strength of the semiconductor substrate 125a when combined with other elements.

As shown in FIG. 14 or FIG. 21, the semiconductor substrates 125 and 125a each include the carrier 120. The first conductive layer 106 and the second conductive layer 112 are electrically connected, and embedded in two opposite surfaces of the carrier 120. The concave portion 120a of the carrier 120 can be used for receiving any semiconductor element such as a semiconductor chip. The semiconductor substrate can have other structural design. FIGS. 22 to 26 show different structures of the semiconductor substrate.

Figure 22:
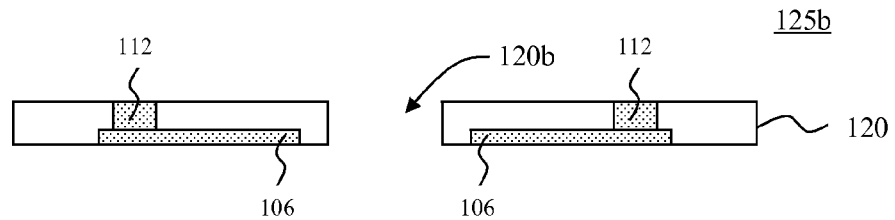
FIGS. 22 to 26 show different structures of the semiconductor substrate.

In FIG. 22, the carrier 120 of the semiconductor substrate 125b has a concave portion in the form of a through hole 120b. The through hole 120b extends from the upper surface of the carrier 120 to the bottom surface of the carrier 120.

Figure 23:
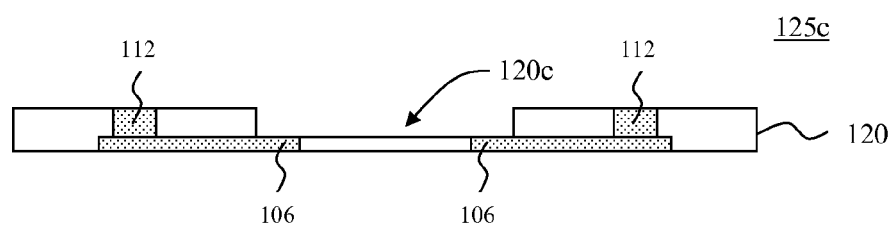

In FIG. 23, the carrier 120 of the semiconductor substrate 125c has a concave portion in the form of a recess 120c. The recess 120c extends from the upper surface of the carrier 120 towards the bottom surface of the carrier 120 till the first conductive layer 106, partially exposing the surface of the first conductive layer 106, which enables the semiconductor chip (not shown) inside the recess 120c to electrically connect to the first conductive layer 106.

Figure 24:
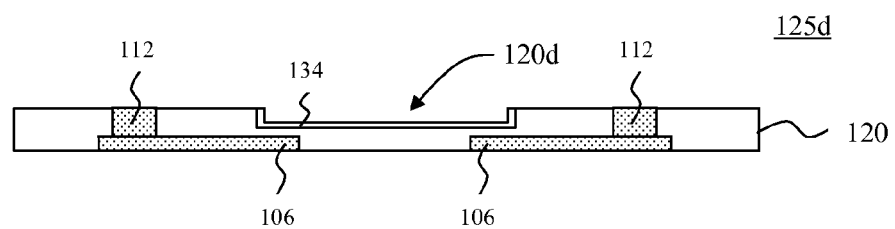
Figure 27:
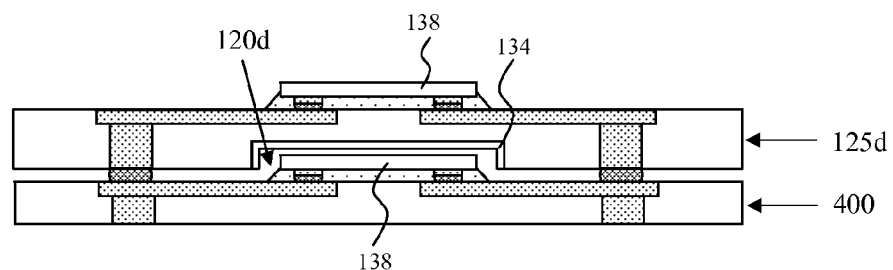
FIG. 27 shows two semiconductor substrates disposed layer by layer.

In FIG. 24, the carrier 120 of the semiconductor substrate 125d has a concave portion in the form of a recess 120d different from the recess 120c of FIG. 23 in the recess depth. The recess 120d extends from the upper surface of the carrier 120 towards the bottom surface of the carrier 120 without exposing the first conductive layer 106. Further, a metallic shielding layer 134 is disposed on the inner surface of the recess 120a for providing an electrostatic discharge (ESD) protection function. Besides, the metallic shielding layer 134 can extend to the upper surface of the carrier 120. FIG. 27 shows two semiconductor substrates 125d disposed layer by layer. A semiconductor chip 136 disposed inside the recess 120d of upper semiconductor substrate 125d is electrically connected to the upper surface of the lower semiconductor substrate 125d. The metallic shielding layer 134 of the recess 120d functions as an ESD protection layer of the semiconductor chip 136, and isolates the semiconductor chip 136 from the upper semiconductor substrate 125d and another semiconductor chip 138.

Figure 25:
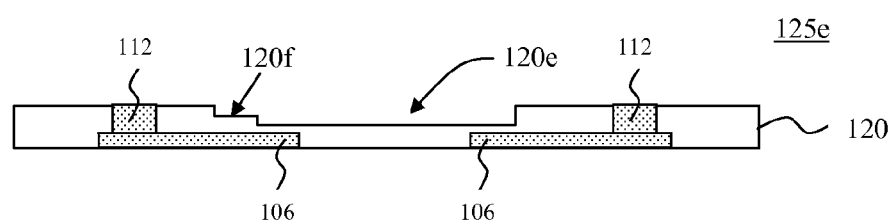

In FIG. 25, the carrier 120 of the semiconductor substrate 125e has a concave portion in the form of a recess 120e having a step 120f. There is a height difference between the step 120f and the upper surface of the carrier 120. When a metallic shielding layer (as the metallic shielding layer 135 of FIG. 24) is disposed in the recess 120e, the metallic shielding layer can further extend to the step 120f for electrically connecting to other element.

Figure 26:
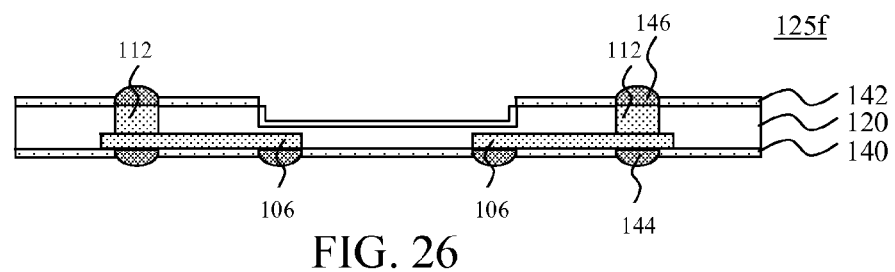

In FIG. 26, the semiconductor substrate 125f further includes passivation layers 140 and 142 disposed on the bottom surface and the upper surface of the carrier 120, respectively. Preferably, the passivation layers 140 and 142 are formed by screen printing followed by curing, and have openings for exposing the first conductive layer 106 and the second conductive layer 112, enabling the first conductive layer 106 and the second conductive layer 112 to electrically connect to other elements by the solder layers 144 and 146. Preferably, the solder layers 144 and 146 are formed by electroplating or solder paste printing process. The passivation layer can be only disposed on the upper surface or the bottom surface of the carrier 120. The disposition and number of the passivation layer depend on the requirement for the semiconductor device.

Figure 28:
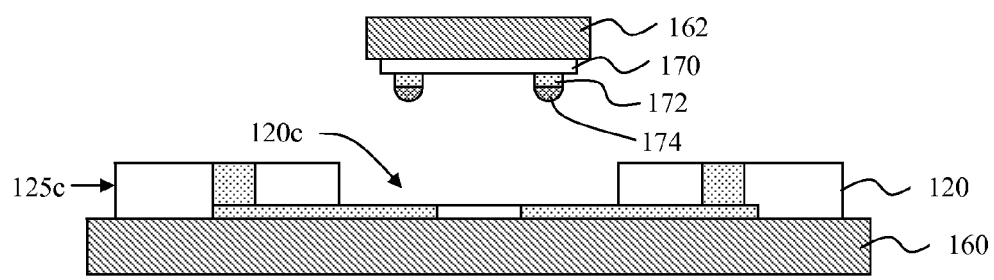
FIGS. 28 to 29 show the process of disposing a semiconductor chip onto a semiconductor substrate.
Figure 29:
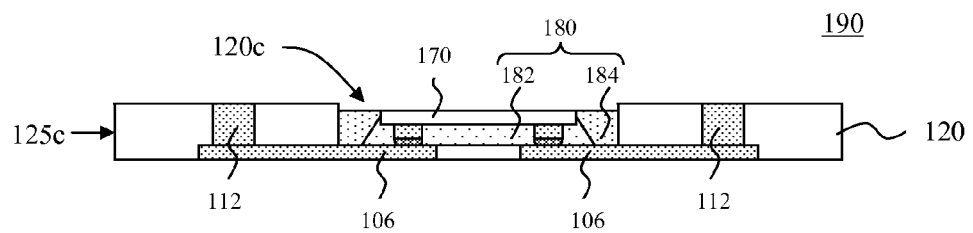

FIGS. 28 to 29 show the process of disposing a semiconductor chip onto a semiconductor substrate. All the semiconductor substrates disclosed above can be combined with at least one semiconductor chip, but here the semiconductor substrate 125c of FIG. 23 is taken for example.

As shown in FIG. 28, the semiconductor substrate 125c is positioned on the bonding platform 160, and its recess 120c faces upwardly. Take flip-chip packaging for example. After manufacturing a semiconductor chip 170, which is disposed on a bonding head 162, the bonding head 160 and the semiconductor chip 170 are reversed together and moved to the location above the recess 120c. Preferably, a connecting structure disposed on the semiconductor chip 170 is first aligned with the first conductive layer 106 before the semiconductor chip 170 is moved to the recess 120c. The connecting structure preferably includes copper bumps 172 and solder layers 174 used for electrically connecting the semiconductor chip 170 to the first conductive layer 106. The attachment between the semiconductor chip 170 to the first conductive layer 106 can be achieved by thermo-compression bonding.

Next, as shown in FIG. 29, a filling structure 180 is formed in the recess 120c for filling the gap between the semiconductor chip 170 and the carrier 120, thereby forming a semiconductor package 190. The filling structure 180 includes at least one filling material, for example, a first filling material 182 and a second filling material 184. The first filling material 182 is located between the semiconductor chip 170 and the carrier 120. The second filling material 184 surrounds the semiconductor chip 170 and the first filling material 182. Preferably, the first filling material 182 is an underfill adhesive for assisting in the attachment between the semiconductor chip 170 and the carrier 120. The second filling material 184 is preferably a molding compound for sealing the semiconductor chip 170 and the first filling material 182 and strengthening the support of the carrier 120 for the semiconductor chip 170. Preferably, the upper surface of the semiconductor chip 170 is exposed for better heat dissipation. Alternatively, the second filling material 184 can completely encapsulate the semiconductor chip 170 for better protection.

Figure 30:
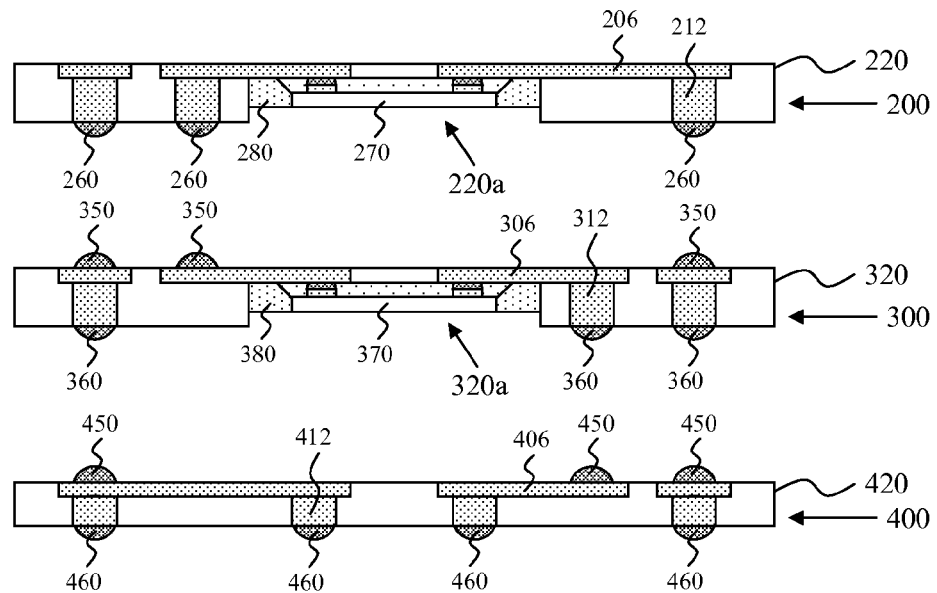
FIGS. 30 to 32 show the process of a manufacturing, method of the semiconductor device.
Figure 31:
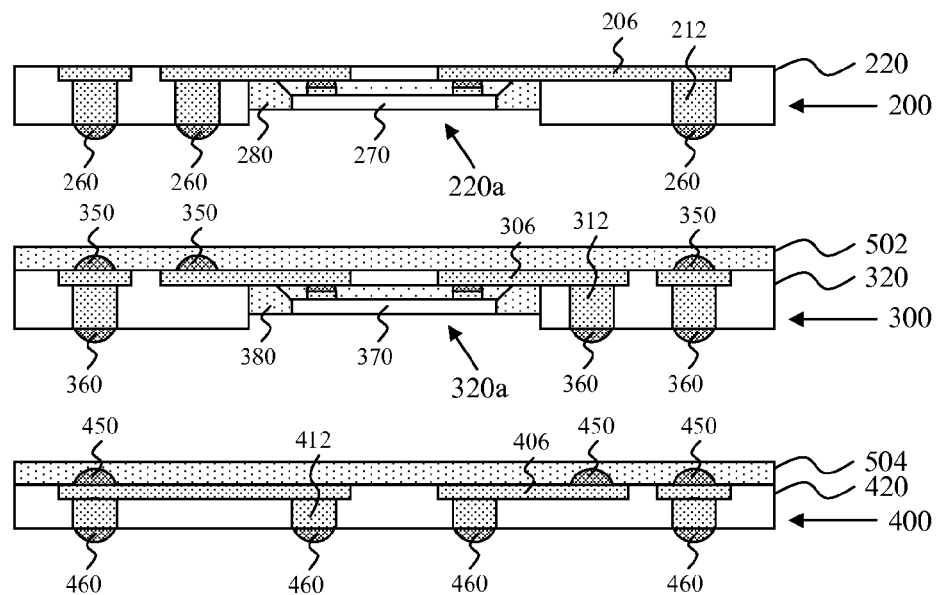
Figure 32:
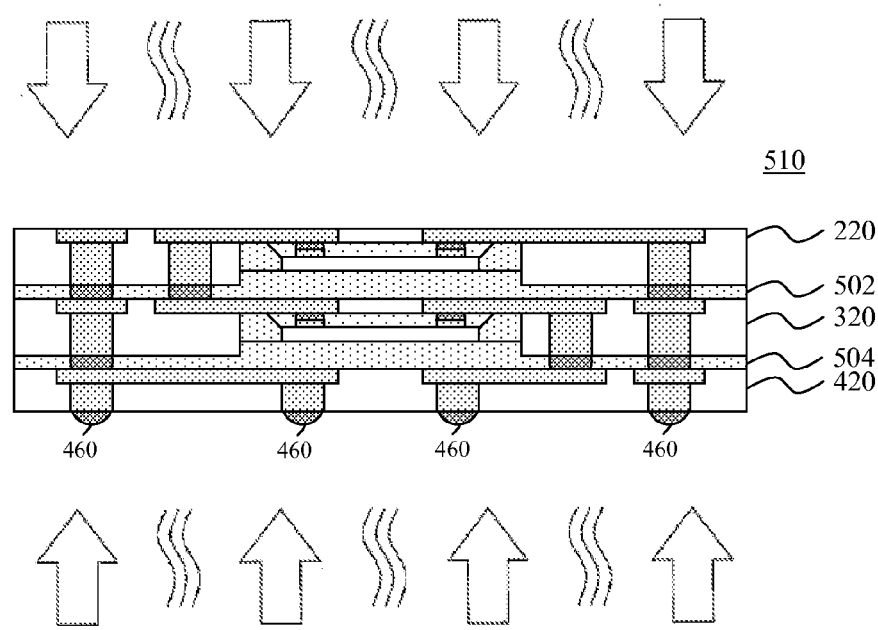

The semiconductor substrate and the semiconductor package are further applied in different kinds of semiconductor device. FIGS. 30 to 32 show the process of a manufacturing method of the semiconductor device. Firstly, as shown in FIG. 30, a plurality of semiconductor substrates 200, 300, and 400 of the same or different structures are provided. The semiconductor substrate 200 includes a first conductive layer 206, a second conductive layer 212 and a carrier 220. The first conductive layer 206 and the second conductive layer 212 are electrically connected and embedded in the upper surface and the bottom surface of the carrier 220, respectively. Preferably, a plurality of conductive pads 250 (or solder layers) are disposed on the upper surface of the carrier 220 in accordance with the first conductive layer 206 for electrically connecting to other semiconductor substrate or electronic component before assembling. The material of the conductive pads 250 can be metal such as Au, Ag, etc. Further, a plurality of solder layers 260 (or conductive pads) are disposed on the bottom surface of the carrier 220 in accordance with the second conductive layer 212 for connecting to the semiconductor substrate 300. The material of the solder layers 260 can be metal such as Sn, Ag, etc. Preferably, a semiconductor chip 270 and a filling structure 280 have been disposed in the recess 220a of the carrier 220 before the semiconductor substrate 200 is assembled.

The semiconductor substrate 300 includes a first conductive layer 306, a second conductive layer 312 and a carrier 320. The first conductive layer 306 and the second conductive layer 312 are electrically connected and embedded in the upper surface and the bottom surface of the carrier 320, respectively. Preferably, a plurality of conductive pads 350 (or solder layers) are disposed on the upper surface of the carrier 320 in accordance with the first conductive layer 306 for electrically connecting to the solder layers 260 of the semiconductor substrate 200. The material of the conductive pads 350 can be metal such as Au, Ag, etc. A plurality of solder layers 360 (or conductive pads) are disposed on the bottom surface of the carrier 320 in accordance with the second conductive layer 312 for connecting to the semiconductor substrate 400. The material of the solder layers 360 can be metal such as Sn, Ag, etc. Preferably, a semiconductor chip 370 and a filling structure 380 have been disposed in the recess 320a of the carrier 320 before the semiconductor substrate 300 is assembled.

The semiconductor substrate 400 includes a first conductive layer 406, a second conductive layer 412 and a carrier 420. The first conductive layer 406 and the second conductive layer 412 are electrically connected and embedded in the upper surface and the bottom surface of the carrier 420, respectively. Preferably, a plurality of solder layers 450 (or conductive pads) are disposed on the upper surface of the carrier 420 in accordance with the first conductive layer 406 for electrically connecting to the solder layers 360 of the semiconductor substrate 300. A plurality of solder layers 460 (or conductive pads) are disposed on the bottom surface of the carrier 420 in accordance with the second conductive layer 412 for connecting to other semiconductor substrate or electronic component. The material of the solder layers 450 and 460 can be metal such as Sn, Ag, etc. Besides, some conductive pads 470 are disposed in the recess 420a for connecting to other element. Preferably, the solder layers 260, 360, 450 and 460 and the conductive pads 250, 350 and 470 are formed on the exposed surfaces of the first conductive layers 206, 306 and 406 and the second conductive layers 212, 312 and 412 by plating.

Next, a plurality adhesive layers are provided between the semiconductor substrates. As shown in FIG. 31, an adhesive layer 502 is located between the semiconductor substrates 200 and 300. Preferably, the adhesive layer 502 is directly coated on the upper surface of the semiconductor substrate 300. Another adhesive layer 504 is located between the semiconductor substrates 300 and 400. Preferably, the adhesive layer 504 is directly coated on the upper surface of the semiconductor substrate 400. The material of the adhesive layers 502 and 504 is preferably insulating material.

Then, the semiconductor substrates are combined by bonding the adhesive layers. As shown in FIGS. 31 and 32, the semiconductor substrates 200, 300 and 400 are aligned and moved closer to one another by pressure so as to be assembled and stacked together. In the meantime, the semiconductor substrates 200, 300 and 400 stacked together are also cured to make the connection between the adhesive layers, the solder layers and the conductive pads, completing the required electrical connection between the semiconductor substrates 200, 300 and 400. Herein, the manufacture of a semiconductor device 510 is accomplished. The semiconductor device 510 can be further connected to other electronic component or substrate by the conductive pads 250 and 470 and the solder layers 460 in order to expand the structure of the semiconductor device 510 as well as its operating performance.

The semiconductor substrate, the semiconductor package and the semiconductor device and manufacturing methods thereof according to preferred embodiment of the invention are disclosed above. The semiconductor substrate has a concave portion for receiving a semiconductor element such as a semiconductor chip, which reduces the overall thickness of the device and facilitates the miniaturization of the semiconductor device with stacked substrates. The concave portion of the semiconductor substrate can be a through hole or a recess selectively exposing the package traces for electrically connecting to the semiconductor chip or other element. Furthermore, underfill adhesive and molding compound can be formed in the recess for enhancing the attachment of the semiconductor chip. The electrical connection between the stacked semiconductor substrates and the semiconductor chip is achieved by conductive pads and solder layers. In conclusion, the semiconductor device is expandable with its thickness effectively controlled, and is more competitive in the semiconductor market than the conventional device.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor substrate, comprising:
    a carrier having a first surface, a second surface opposite the first surface and at least one concave portion, wherein the concave portion is a recess extending from the second surface towards the first surface;
    a metallic shielding layer disposed on the surface in the recess;
    a plurality of conductive layers embedded in the carrier for connecting the first surface to the second surface, wherein a first conductive layer is embedded in the first surface, a second conductive layer is embedded in the second surface and electrically connected to the first conductive layer.

2. The semiconductor substrate according to claim 1, wherein the concave portion comprises a through hole extending to the first surface.

3. The semiconductor substrate according to claim 1, wherein the recess partially exposes the first conductive layer.

4. The semiconductor substrate according to claim 1, wherein the metallic shielding layer further extends to the second surface.

5. The semiconductor substrate according to claim 1, wherein the carrier further comprises a step within the recess, and there is a height difference between the step and the second surface.

6. The semiconductor substrate according to claim 1, wherein the carrier comprises at least one insulative molding material layer.

7. The semiconductor substrate according to claim 1, further comprising a passivation layer disposed on the first conductive layer and the first surface.

8. The semiconductor substrate according to claim 7, wherein the first conductive layer comprises a plurality of traces, the passivation layer has a plurality of openings corresponding to the plurality of traces and a solder layer is disposed in each opening for connecting the semiconductor substrate to other semiconductor elements.

9. A semiconductor package, comprising:
a carrier having a first surface, a second surface opposite the first surface and at least one concave portion, wherein the concave portion is a recess extending from the second surface towards the first surface;
a plurality of conductive layers embedded in the carrier for connecting the first surface to the second surface, wherein a first conductive layer is embedded in the first surface, a second conductive layer is embedded in the second surface and electrically connected to the first conductive layer;
a semiconductor chip disposed in the concave portion; and
a filling structure disposed in the concave portion for encapsulating the semiconductor chip, wherein the filling structure comprises a first filling material and a second filling material, the first filling material is disposed between the semiconductor chip and the carrier, the second filling material encapsulates the semiconductor chip and the first filling material.

10. The semiconductor package according to claim 9, wherein the filling structure fills the concave portion and exposes a surface of the semiconductor chip.

11. The semiconductor package according to claim 9, wherein the concave portion comprises a through hole extending to the first surface.

12. The semiconductor package according to claim 9, wherein the recess partially exposes the first conductive layer.

13. The semiconductor package according to claim 12, wherein the semiconductor chip is electrically connected to the first conductive layer.

14. The semiconductor package according to claim 9, further comprising a metallic shielding layer disposed on the surface in the recess.

15. The semiconductor package according to claim 14, wherein the metallic shielding layer further extends to the second surface.

16. The semiconductor package according to claim 9, further comprising a step within the recess and there is a height difference between the step and the second surface.

17. The semiconductor package according to claim 9, wherein the carrier comprises at least one insulative molding material layer.

18. The semiconductor package according to claim 9, further comprising a passivation layer disposed on the first conductive layer and the first surface.

19. The semiconductor package according to claim 18, wherein the first conductive layer comprises a plurality of traces, the passivation layer has a plurality of openings corresponding to the plurality of traces and a solder layer is disposed in each opening for connecting the semiconductor package to other semiconductor elements.

20. A semiconductor device, comprising:
a plurality of semiconductor substrates disposed in layers and an adhesive layer disposed between adjacent semiconductor substrates for combining the plurality of semiconductor substrates; wherein at least one semiconductor substrate comprises:
a carrier having a first surface and a second surface opposite the first surface, and at least one concave portion; and
a plurality of conductive layers embedded in the carrier for connecting the first surface to the second surface, wherein a first conductive layer is embedded in the first surface, a second conductive layer is embedded in the second surface and electrically connected to the first conductive layer.

21. The semiconductor device according to claim 20, further comprising at least one solder layer disposed between adjacent semiconductor substrates for connecting the plurality of semiconductor substrates.

22. The semiconductor device according to claim 20, further comprising at least one semiconductor chip disposed in the concave portion.

23. The semiconductor device according to claim 22, wherein the concave portion partially exposes the first conductive layer and the semiconductor chip is electrically connected to the first conductive layer.

24. The semiconductor device according to claim 22, further comprising at least one filling material disposed in the concave portion and encapsulates the semiconductor chip.

25. The semiconductor device according to claim 24, wherein the filling material fills the concave portion and exposes a surface of the semiconductor chip.

26. The semiconductor device according to claim 20, wherein the concave portion comprises a through hole extending from the first surface to the second surface.

27. The semiconductor device according to claim 20, wherein the concave portion is a recess extending from the second surface towards the first surface.

28. The semiconductor device according to claim 27, wherein the recess partially exposes the first conductive layer.

29. The semiconductor device according to claim 27, further comprising a metallic shielding layer disposed on the surface in the recess.

30. The semiconductor device according to claim 29, wherein the metallic shielding layer further extends to the second surface.

31. The semiconductor device according to claim 27, wherein the semiconductor substrate further comprises a step within the recess and there is a height difference between the step and the second surface.

32. The semiconductor device according to claim 20, wherein the carrier comprises at least one insulative molding material layer.

33. The semiconductor device according to claim 20, wherein the semiconductor substrate further comprises a passivation layer disposed on the first conductive layer and the first surface.

34. The semiconductor device according to claim 33, wherein the first conductive layer comprises a plurality of traces, the passivation layer has a plurality of openings corresponding to the plurality of traces and a solder layer is disposed in each opening for connecting the plurality of semiconductor substrates.

35. The semiconductor device according to claim 22, wherein the plurality of semiconductor substrates comprises an upper semiconductor substrate having the concave portion and a lower semiconductor substrate, the semiconductor chip is disposed on the lower semiconductor substrate within the concave portion of the upper semiconductor substrate.

36. The semiconductor device according to claim 35, further comprising at least one filling material disposed on the lower semiconductor substrate within the concave portion of the upper semiconductor substrate and encapsulates the semiconductor chip.

37. The semiconductor device according to claim 35, wherein the semiconductor chip is electrically connected to the lower semiconductor substrate.

* * * * *